United States Patent
Kiselev et al.

(10) Patent No.: US 12,416,742 B2
(45) Date of Patent: Sep. 16, 2025

(54) EVALUATION AND VISUALIZATION OF AZIMUTHAL RESISTIVITY DATA

(71) Applicant: Halliburton Energy Services, Inc., Houston, TX (US)

(72) Inventors: Vladimir Yuryevich Kiselev, Conroe, TX (US); Jeremy James Combs, The Woodlands, TX (US); David Franklin Anthony, Spring, TX (US); David J. Ortiz, Spring, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 382 days.

(21) Appl. No.: 16/890,427

(22) Filed: Jun. 2, 2020

(65) Prior Publication Data
US 2021/0373190 A1    Dec. 2, 2021

(51) Int. Cl.
| | | |
|---|---|---|
| *G01V 3/34* | (2006.01) | |
| *G01V 3/38* | (2006.01) | |
| *G06F 30/20* | (2020.01) | |

(52) U.S. Cl.
CPC .................. *G01V 3/34* (2013.01); *G01V 3/38* (2013.01); *G06F 30/20* (2020.01)

(58) Field of Classification Search
CPC ............ G01V 3/34; G01V 3/38; G06F 30/20
See application file for complete search history.

(56) References Cited

U.S. PATENT DOCUMENTS

| | | | |
|---|---|---|---|
| 9,651,704 B2 * | 5/2017 | Bloemenkamp | G01V 3/20 |
| 10,839,278 B1 * | 11/2020 | Fu | G01V 3/00 |

(Continued)

FOREIGN PATENT DOCUMENTS

| | | |
|---|---|---|
| CN | 104636592 A | 5/2015 |
| CN | 104989360 A | 10/2015 |
| WO | 2009/029679 A2 | 3/2009 |

OTHER PUBLICATIONS

Niasari; A short introduction to geological strike and geo-electric strike, 2016.*

(Continued)

*Primary Examiner* — Arleen M Vazquez
*Assistant Examiner* — Lynda Dinh
(74) *Attorney, Agent, or Firm* — Benjamin Ford; Parker Justiss, P.C.

(57) ABSTRACT

A method is provided for processing resistivity data associated with a formation. The resistivity data relating to the formation proximate to a wellbore is obtained. The resistivity data is divided in to a preconfigured plurality of bins, wherein the resistivity data associated with each bin is measured in the direction or the range of directions corresponding to the bin. A rose diagram is generated for a portion of the resistivity data associated with a measured depth of the wellbore. The rose diagram includes a circle divided into a plurality of sectors, wherein each sector corresponds to a bin. Each sector visually represents the resistivity data relating to the formation in a direction or range of directions from the wellbore corresponding to the bin. The generated rose diagram is rendered for display. The rendered rose diagram displays the resistivity data in a cross-section perpendicular to the wellbore at the corresponding measured depth.

20 Claims, 10 Drawing Sheets

(56) References Cited

U.S. PATENT DOCUMENTS

| | | | |
|---|---|---|---|
| 2010/0286916 A1* | 11/2010 | Wang | G01V 3/20 |
| | | | 702/9 |
| 2015/0241591 A1* | 8/2015 | Burmester | G06K 9/64 |
| | | | 702/7 |
| 2016/0139292 A1* | 5/2016 | Lie | G01V 3/24 |
| | | | 324/355 |
| 2019/0361138 A1 | 11/2019 | Bennett et al. | |
| 2020/0096665 A1 | 3/2020 | Wu et al. | |

OTHER PUBLICATIONS

Onwubuariri et al; Analysing Ned-Tectonic Effects on Gully Development Within Orlu and Environs South-Eastern Nigeria From Landsat Imagery and Azimuthal Sounding Data, 2018.*

International Search Report and Written Opinion issued in related PCT Application No. PCT/US2020/036032 mailed Feb. 26, 2021, 9 pages.

\* cited by examiner

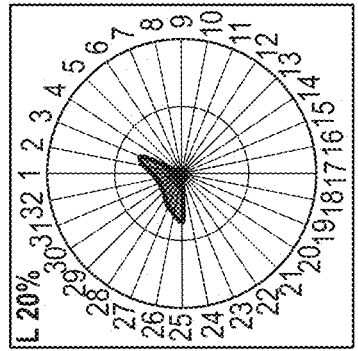
FIG. 6B
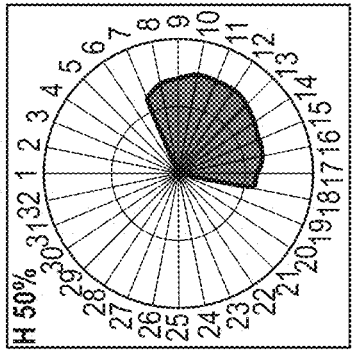
FIG. 6C
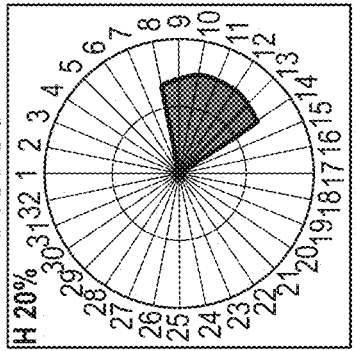
FIG. 6D
| BIN | ALL | LOW 20% | HIGH 50% | HIGH 20% |
|---|---|---|---|---|
| 1 | 2.7317 | 2.7317 | 1 | 1 |
| 2 | 3.6657 | 3.6657 | 1 | 1 |
| 3 | 4.6924 | 4.6924 | 1 | 1 |
| 4 | 6.0762 | 1 | 1 | 1 |
| 5 | 8.1261 | 1 | 1 | 1 |
| 6 | 10.5468 | 1 | 1 | 1 |
| 7 | 15.2904 | 1 | 15.2904 | 1 |
| 8 | 21.4378 | 1 | 21.4378 | 21.4378 |
| 9 | 24.5195 | 1 | 24.5195 | 24.5195 |
| 10 | 29.5468 | 1 | 29.5468 | 29.5468 |
| 11 | 29.4379 | 1 | 29.4379 | 29.4379 |
| 12 | 29.1524 | 1 | 29.1524 | 29.1524 |
| 13 | 25.7966 | 1 | 25.7966 | 25.7966 |
| 14 | 22.1989 | 1 | 22.1989 | 22.1989 |
| 15 | 18.898 | 1 | 18.898 | 1 |
| 16 | 17.9115 | 1 | 17.9115 | 1 |
| 17 | 14.4179 | 1 | 14.4179 | 1 |
| 18 | 13.2787 | 1 | 13.2787 | 1 |
| 19 | 11.7541 | 1 | 1 | 1 |
| 20 | 12.3142 | 1 | 1 | 1 |
| 21 | 10.8537 | 1 | 1 | 1 |
| 22 | 9.389 | 1 | 1 | 1 |
| 23 | 8.0215 | 1 | 1 | 1 |
| 24 | 6.7102 | 1 | 1 | 1 |
| 25 | 5.0555 | 5.0555 | 1 | 1 |
| 26 | 3.864 | 3.864 | 1 | 1 |
| 27 | 3.1381 | 3.1381 | 1 | 1 |
| 28 | 2.8262 | 2.8262 | 1 | 1 |
| 29 | 2.2904 | 2.2904 | 1 | 1 |
| 30 | 2.218 | 2.218 | 1 | 1 |
| 31 | 2.3086 | 2.3086 | 1 | 1 |
| 32 | 2.3699 | 2.3699 | 1 | 1 |
FIG. 6A

EVALUATION AND VISUALIZATION OF AZIMUTHAL RESISTIVITY DATA

TECHNICAL FIELD

The present disclosure relates generally to well drilling operations and, more particularly, to evaluation and visualization of azimuthal resistivity data related to downhole formations proximate to a wellbore.

BACKGROUND

Modern oil field operators demand access to a great quantity of information regarding the parameters and conditions encountered downhole. Such information typically includes characteristics of the earth formations traversed by the wellbore and data relating to the size and configuration of the wellbore itself. The collection of information relating to conditions downhole, which commonly is referred to as "logging," can be performed by several methods including wireline logging and "logging while drilling" (LWD).

In wireline logging, a probe or "sonde" is lowered into the wellbore after some or all of the well has been drilled. The sonde hangs at the end of a long cable or "wireline" that provides mechanical support to the sonde and also provides an electrical connection between the sonde and electrical equipment located at the surface of the well. In accordance with existing logging techniques, various parameters of the earth's formations are measured and correlated with the position of the sonde in the wellbore as the sonde is pulled uphole.

In LWD, the drilling assembly includes sensing instruments that measure various parameters as the formation is being penetrated, thereby enabling measurements of the formation while it is less affected by fluid invasion. While LWD measurements are desirable, drilling operations create an environment that is generally hostile to electronic instrumentation, telemetry, and sensor operations.

Various measurement tools exist for use in wireline logging and LWD applications. One such tool is the resistivity tool, which includes one or more antennas for transmitting an electromagnetic signal into the formation and one or more antennas for receiving a formation response. When operated at low frequencies, the resistivity tool may be called an "induction" tool, and at high frequencies it may be called an electromagnetic wave propagation tool. Though the physical phenomena that dominate the measurement may vary with frequency, the operating principles for the tool are consistent. In some cases, the amplitude and/or phase of the received signals are compared to the amplitude and/or phase of the transmitted signals to measure the formation resistivity. In other cases, the amplitude and/or phase of the received signals are compared to each other to measure the formation resistivity.

In these and other logging environments, measured parameters are usually recorded and displayed in the form of a log, for example, a two-dimensional graph showing the measured parameter as a function of tool position or depth. For example, when plotted as a function of depth or tool position in the wellbore, the resistivity tool measurements are termed "resistivity logs". In addition to making parameter measurements as a function of depth, some logging tools also provide parameter measurements as a function of azimuth. Such tool measurements have often been displayed as two-dimensional images of the wellbore wall, with one dimension representing tool position or depth, the other dimension representing azimuthal orientation, and the pixel intensity or color representing the parameter value.

Recently, however, improved logging tools have been developed that can measure one or more formation parameters as a function of distance from the wellbore axis, as well as depth and azimuth. Such additional information would provide very helpful insight to drillers and other users of log information. For example, such logs may provide indications of hydrocarbon concentrations and other information useful to drillers and completion engineers. In particular, azimuthally-sensitive logs may provide information useful for steering the drilling assembly.

However, the traditional telemetry and data presentation methods are increasingly unable to meaningfully convey such additional information.

BRIEF DESCRIPTION OF DRAWINGS

Some specific exemplary aspects of the disclosure may be understood by referring, in part, to the following description and the accompanying drawings.

FIG. 6A illustrates example filtered data set including filtered resistivity data subsets of the resistivity data, in accordance with one or more aspects of the present disclosure.

FIG. 6B illustrates an example rose diagram representing the lowest 20% resistivity values of the resistivity data, in accordance with certain aspects of the present disclosure.

FIG. 6C illustrates an example rose diagram representing the highest 50% resistivity values of the resistivity data, in accordance with one or more aspects of the present disclosure.

FIG. 6D illustrates an example rose diagram representing the highest 20% resistivity values of the resistivity data from FIG. 6A, in accordance with one or more aspects of the present disclosure.

While aspects of this disclosure have been depicted and described and are defined by reference to exemplary aspects of the disclosure, such references do not imply a limitation on the disclosure, and no such limitation is to be inferred. The subject matter disclosed is capable of considerable modification, alteration, and equivalents in form and function, as will occur to those skilled in the pertinent art and having the benefit of this disclosure. The depicted and described aspects of this disclosure are examples only, and not exhaustive of the scope of the disclosure.

DETAILED DESCRIPTION

The present application relates to processing resistivity data associated with a formation proximate to a wellbore. Aspects of the present disclosure provide improved techniques for processing and visualizing azimuthal resistivity data relating to formations proximate to a wellbore. One or more aspects provide techniques for generating a rose diagram representing resistivity field in a cross-section perpendicular to a wellbore at a selected measured depth. The rose diagram, when rendered and displayed on a display device, visually shows a clear representation of the resistivity field around the wellbore at the measured depth. One or more aspects provide techniques for generating a three-dimensional resistivity model of the wellbore based on a plurality of rose diagrams generated for different measured depths along the wellbore. The three-dimensional resistivity model provides comprehensive illustration of distribution of resistivity values of the formation surrounding the wellbore along the entire length of the wellbore.

The techniques for processing and visualizing azimuthal resistivity data as discussed in accordance with aspects of the present disclosure provide several advantages over current techniques. For example, a clear visual representation of the resistivity field around the wellbore at selected depths of the wellbore allows an operator to quickly and accurately interpret the azimuthal resistivity data and make accurate geosteering decisions. Even complex geological scenarios may be accurately interpreted with minimal effort. This may minimize time, costs and risks related to such systems. Further, the clear representation of the resistivity field around the wellbore helps reduce uncertainties typically associated with the resistivity field to the side of the wellbore.

Figure 5:
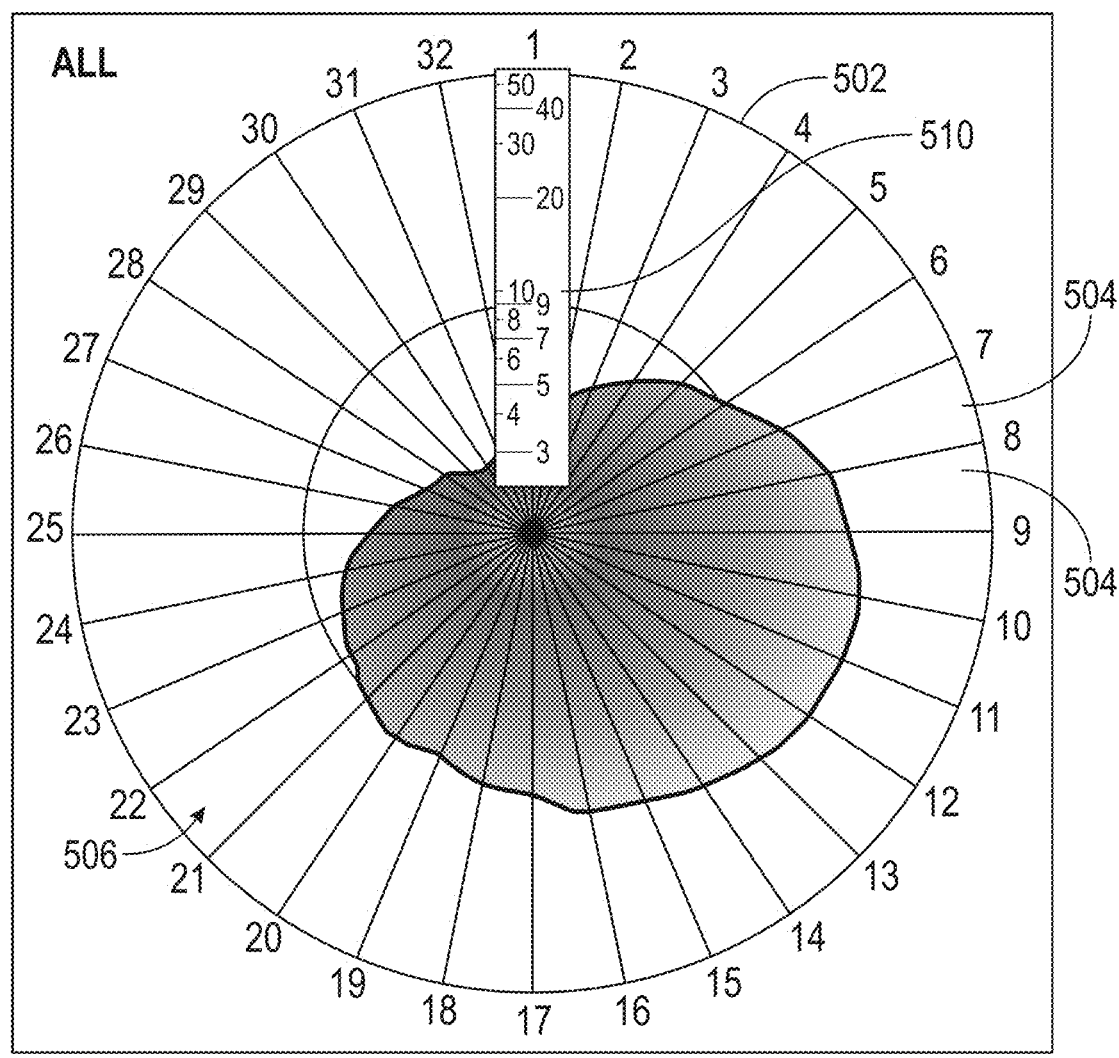
FIG. 5 illustrates an example rose diagram generated based on resistivity data, in accordance with one or more aspects of the present disclosure.
Figure 8A:
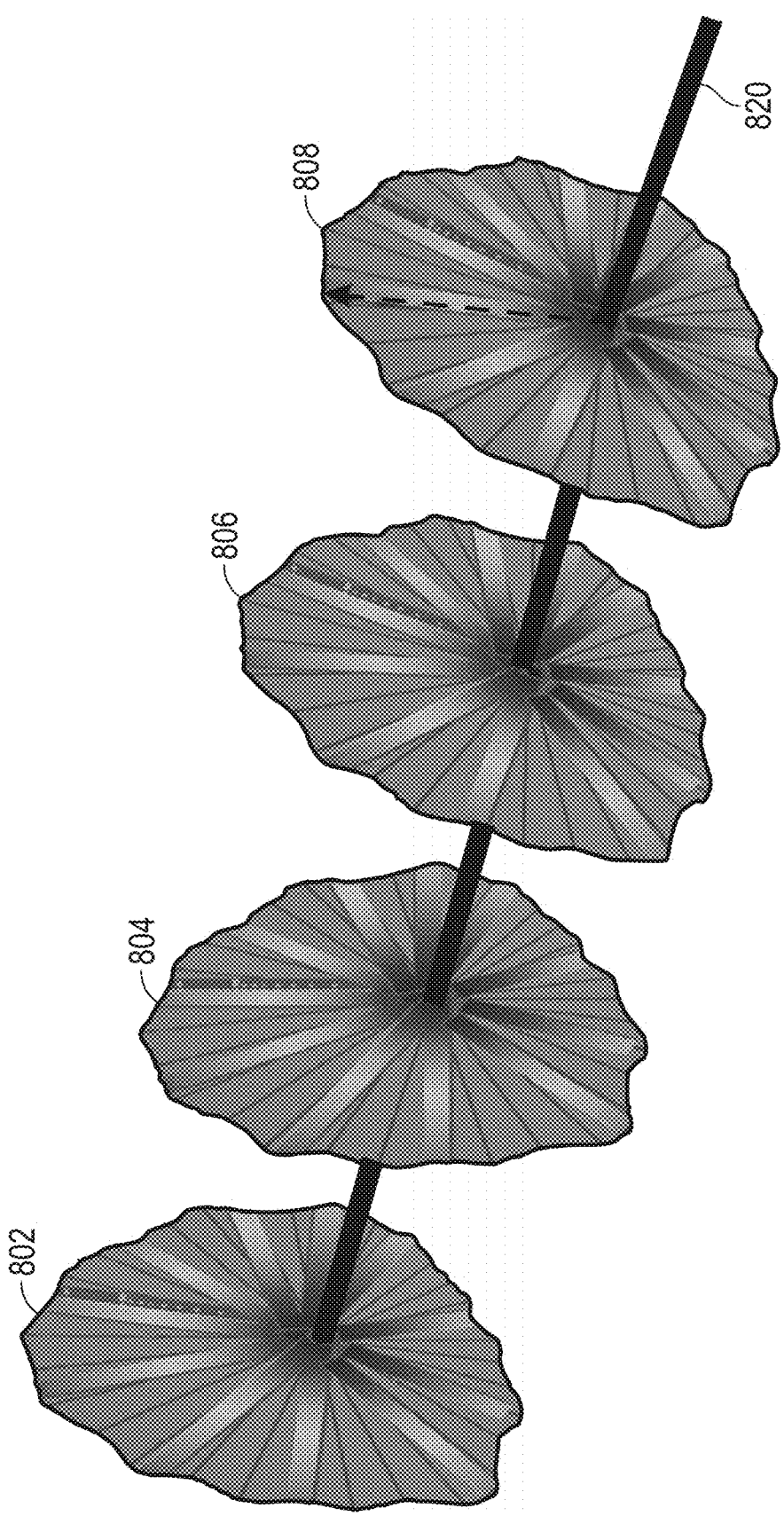
FIG. 8A illustrates an example generation of a resistivity model based on rose diagrams at different measured depths along the wellbore, in accordance with one or more aspects of the present disclosure.
Figure 8B:
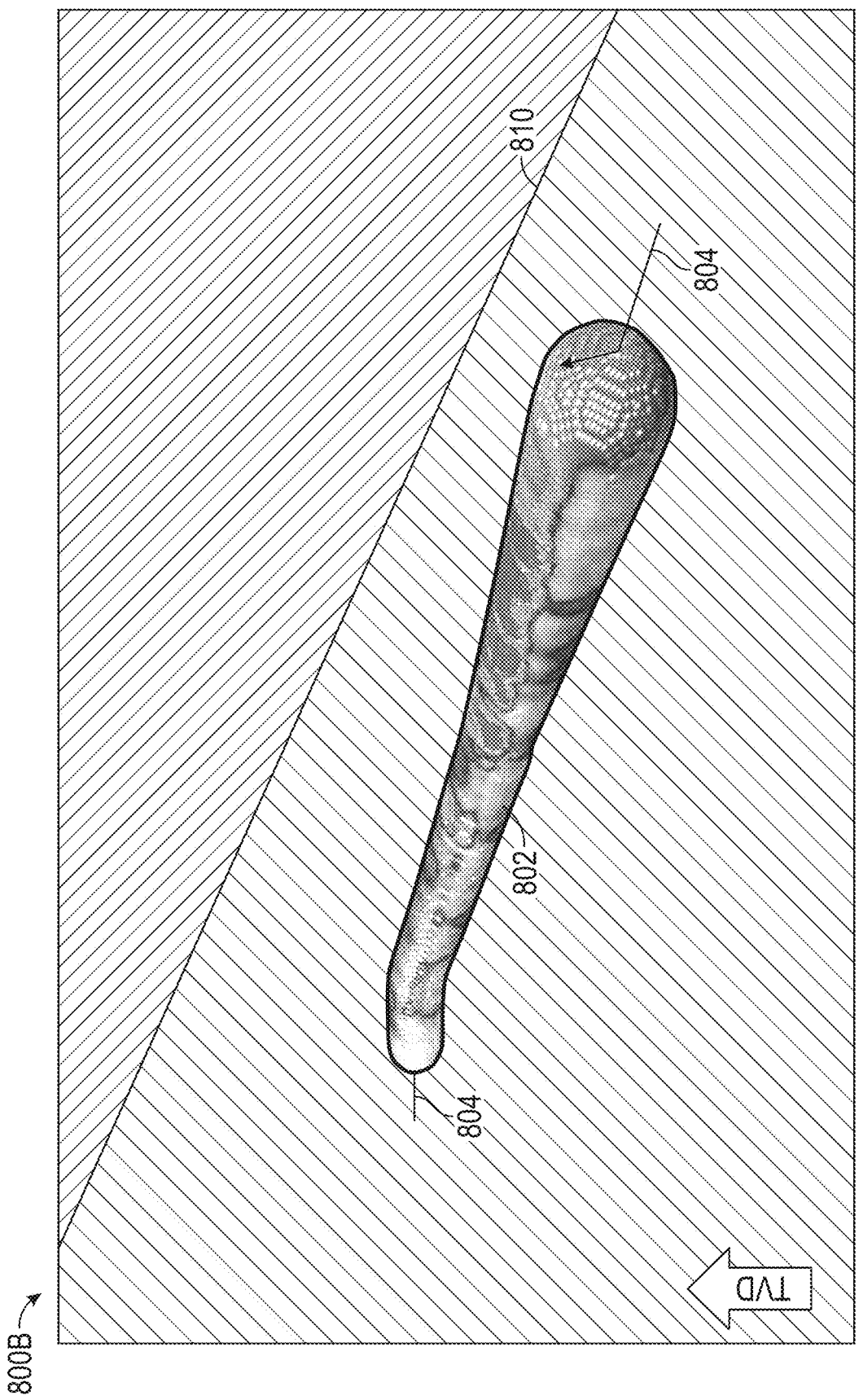
FIG. 8B illustrates a three-dimensional resistivity model of a wellbore generated based on rose diagrams, in accordance with one or more aspects of the present disclosure.

In addition, the techniques described herein improve rendering of azimuthal resistivity data by determining and generating a more accurate rendering of the resistivity field of a formation in a 360-degree field around the wellbore, for example, as illustrated with respect to FIGS. 5, 8A and 8B. Further, by generating a more accurate rendering of the azimuthal resistivity data, these techniques reduce inaccuracies generally associated with rendering azimuthal resistivity data, for example, as illustrated with respect to FIGS. 5, 8A and 8B. Thus, the techniques discussed herein improve the overall quality of rendering azimuthal resistivity data.

For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communication with external devices as well as various input and output (I/O) devices, such as a keyboard, a mouse, and a video display. The information handling system may also include one or more buses operable to transmit communications between the various hardware components. It may also include one or more interface units capable of transmitting one or more signals to a controller, actuator, or like device.

For the purposes of this disclosure, computer-readable media may include any instrumentality or aggregation of instrumentalities that may retain data and/or instructions for a period of time. Computer-readable media may include, for example, without limitation, storage media such as a direct access storage device (for example, a hard disk drive or floppy disk drive), a sequential access storage device (for example, a tape disk drive), compact disk, CD-ROM, DVD, RAM, ROM, electrically erasable programmable read-only memory (EEPROM), and/or flash memory; as well as communications media such wires, optical fibers, microwaves, radio waves, and other electromagnetic and/or optical carriers; and/or any combination of the foregoing.

Illustrative aspects of the present disclosure are described in detail herein. In the interest of clarity, not all features of an actual implementation may be described in this specification. It will of course be appreciated that in the development of any such actual aspect, numerous implementation-specific decisions are made to achieve the specific implementation goals, which will vary from one implementation to another. Moreover, it will be appreciated that such a development effort might be complex and time-consuming, but would, nevertheless, be a routine undertaking for those of ordinary skill in the art having the benefit of the present disclosure.

To facilitate a better understanding of the present disclosure, the following examples of certain aspects are given. In no way should the following examples be read to limit, or define, the scope of the invention. Aspects of the present disclosure may be applicable to horizontal, vertical, deviated, or otherwise nonlinear wellbores in any type of subterranean formation. Aspects may be applicable to injection wells as well as production wells, including hydrocarbon wells. Aspects may be implemented using a tool that is made suitable for testing, retrieval and sampling along sections of the formation. Aspects may be implemented with tools that, for example, may be conveyed through a flow passage in tubular string or using a wireline, slickline, coiled tubing, downhole robot or the like. "Measurement-while-drilling" ("MWD") is the term generally used for measuring conditions downhole concerning the movement and location of the drilling assembly while the drilling continues. "Logging-while-drilling" ("LWD") is the term generally used for similar techniques that concentrate more on formation parameter measurement. Devices and methods in accordance with certain aspects may be used in one or more of wireline (including wireline, slickline, and coiled tubing), downhole robot, MWD, and LWD operations.

Figure 1:
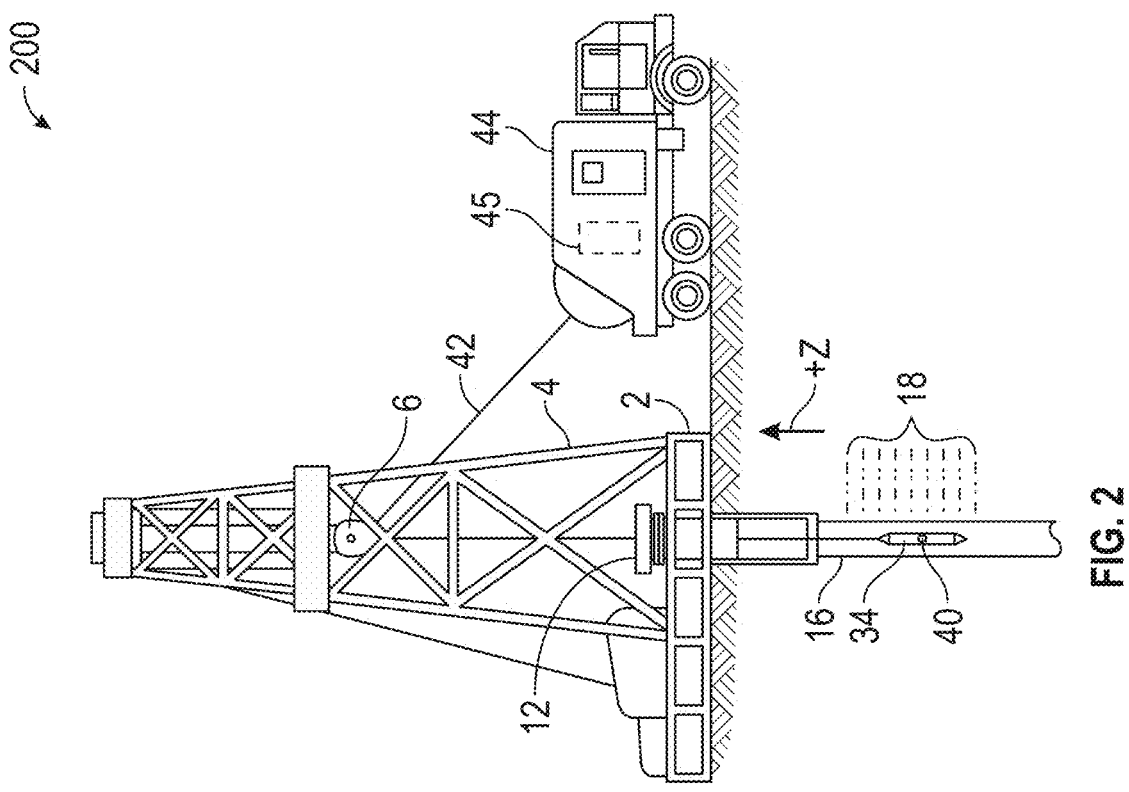
FIG. 1 shows an illustrative logging while drilling (LWD) system, in accordance with one or more aspects of the present disclosure.

FIG. 1 shows an illustrative logging while drilling (LWD) system 100 in which aspects of the present disclosure may be practiced. A drilling platform 2 supports a derrick 4 having a traveling block 6 for raising and lowering a drill string 8. A kelly 10 supports the drill string 8 as it is lowered through a rotary table 12. A drill bit 14 is driven by a downhole motor and/or rotation of the drill string 8. As the drill bit 14 rotates, it creates a wellbore 16 that passes through various formations 18. A pump 20 circulates drilling fluid through a feed pipe 22 to the kelly 10, downhole through the interior of drill string 8, through orifices in drill bit 14, back to the surface via the annulus around drill string 8, and into a retention pit 24. The drilling fluid transports cuttings from the wellbore 16 into the pit 24 and aids in maintaining the wellbore integrity.

An LWD tool 26 is integrated into a bottom-hole assembly (BHA) 32 near the bit 14. As the bit extends the wellbore 16 through the formations, the logging tool 26 collects measurements relating to various formation properties as well as the tool orientation and various other drilling conditions. The logging tool 26 may take the form of a drill collar, for example, a thick-walled tubular that provides weight and rigidity to aid the drilling process. A telemetry sub 28 may be included to transfer tool measurements to a surface receiver 30 and to receive commands from the surface. In one or more aspects, the telemetry sub 28 does not communicate with the surface, but rather stores logging data for later retrieval at the surface when the logging assembly is recovered. In both approaches, limitations are placed on the amount of data that can be collected and stored or communicated to the surface. In certain aspects, the LWD system 100 includes a data processing system 50 (for example, a computer system) positioned at the surface. The data processing system 50 may be communicably coupled to the surface receiver 30 and may receive data collected by the logging tool 26 and/or transmit commands to the logging tool 26 through the surface receiver 30. The data processing system 50 may process the data and generate visualizations for display so as to aid a human operator in steering the wellbore with respect to bed boundaries and/or other wellbores, for example, towards hydrocarbon deposits. For example, as will be described below, the data processing system 50 may process azimuthal resistivity data and generate visualizations for a user display so as to aid an operator's interpretation and understanding of a resistivity field surrounding the wellbore.

Figure 2:
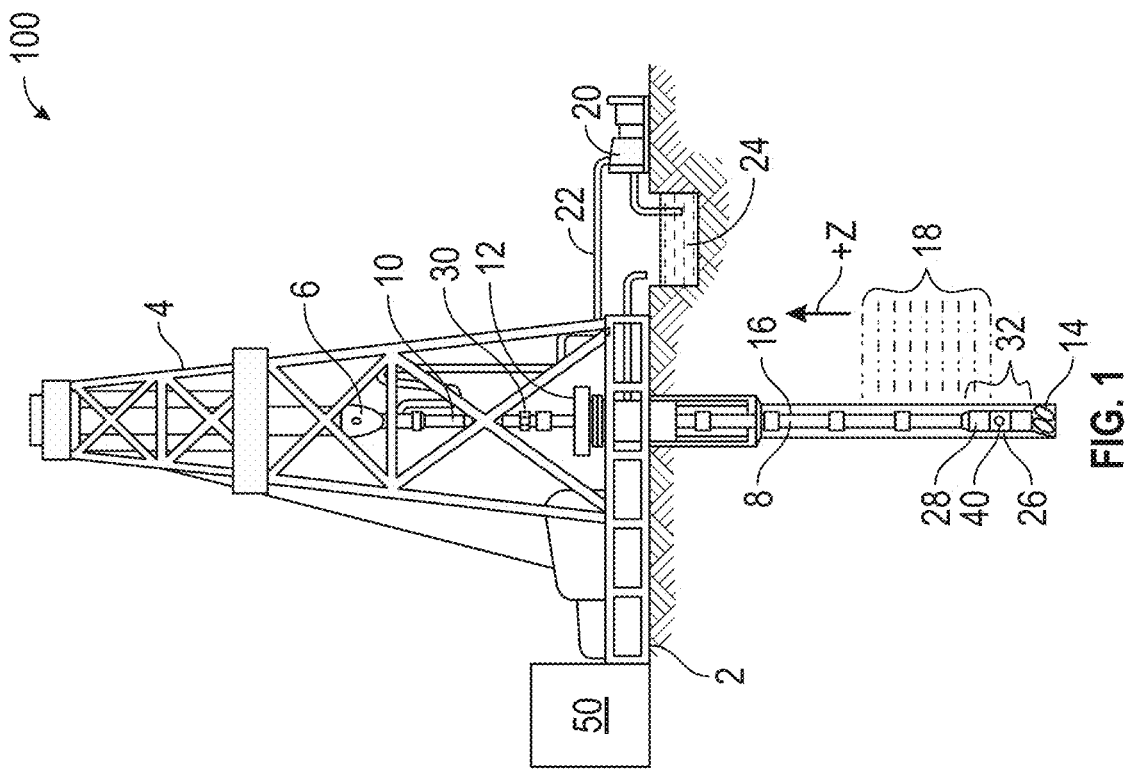
FIG. 2 shows an illustrative wireline logging system, in accordance with one or more aspects of the present disclosure.

At various times during the drilling process, the drill string 8 may be removed from the wellbore as shown in the wireline logging system 200 of FIG. 2. Once the drill string has been removed, logging operations can be conducted using a wireline logging tool 34, for example, a sensing instrument sonde suspended by a cable 42 having conductors for transporting power to the tool and telemetry from the tool to the surface. A wireline logging tool 34 may have pads, centralizing springs or both to maintain the logging tool 34 near the axis of the wellbore 16 as the logging tool 34 is pulled uphole. A logging facility 44 collects measurements from the logging tool 34, and includes a data processing system 45 (for example, computer system) for storing and processing the measurements gathered by the logging tool 34. As will be described below, the data processing system 45 may process azimuthal resistivity data and generate visualizations for a user display so as to aid an operator's interpretation and understanding of a resistivity field surrounding the wellbore.

In each of the foregoing logging environments, the logging tools 26 and 34 of the LWD system of FIG. 1 and the wireline logging system of FIG. 2 respectively preferably include a navigational sensor package 40 that includes directional sensors for determining the inclination angle, the horizontal angle, and the rotational angle (a.k.a. "tool face angle") of the BHA. As is commonly defined in the art, the inclination angle is the deviation from vertically downward, the horizontal angle is the angle in a horizontal plane from true North, and the tool face angle is the orientation (rotational about the tool axis) angle from the high side of the wellbore. In accordance with known techniques, wellbore directional measurements can be made as follows: a three-axis accelerometer measures the earth's gravitational field vector relative to the tool axis and a point on the circumference of the tool called the "tool face scribe line". The tool face scribe line is typically drawn on the surface of the logging tool 26 or logging tool 34 as a line parallel to the tool axis. From this measurement, the inclination and tool face angle of the BHA can be determined. Additionally, a three-axis magnetometer measures the earth's magnetic field vector in a similar manner. From the combined magnetometer and accelerometer data, the horizontal angle of the BHA may be determined.

Moreover, the logging tool in each of the foregoing environments measures at least one formation parameter as a function of tool depth (or position along the wellbore), azimuth, and radial distance from the wellbore axis. Such measurements may be made, for example, by an azimuthally sensitive resistivity logging tool having multiple depths of investigation. Other suitable logging tools may include a "wellbore radar" assembly that detects reflections of high-frequency electromagnetic waves, or ultrasonic imaging tools that similarly detect reflections of acoustic impulses. Certain proposed nuclear logging tools will also provide formation property measurements as a function of position, azimuth, and radial distance. Of course, data from multiple tools can also be combined to further characterize formation properties.

As such logging tools progress along the wellbore, they rotate, employ an azimuthally-distributed array and/or direct azimuthally-steerable sensors 40 to collect measurements as a function of azimuth and radial distance. In some aspects (for example, wireline logging sondes that do not move too quickly), all of the logging data can be conveyed to the surface as it is collected. Such information can be quite valuable to enable the driller to steer the wellbore with respect to bed boundaries and/or other wellbores, thereby, for example, increasing path lengths through the payzone.

Figure 3:
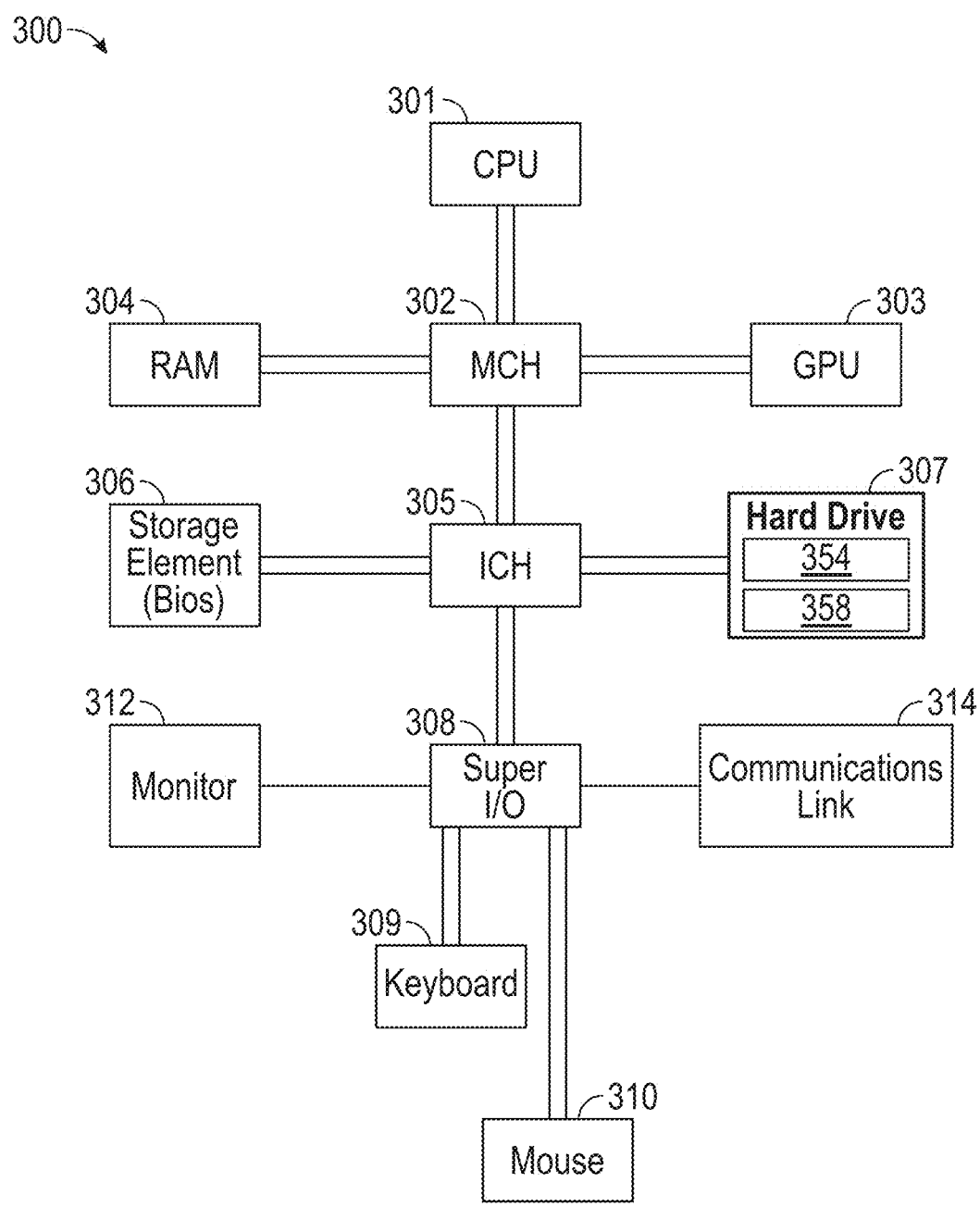
FIG. 3 is a diagram illustrating an example information handling system, in accordance with one or more aspects of the present disclosure.

FIG. 3 is a diagram illustrating an example information handling system 300, for example, for use with or by the LWD system of FIG. 1 or the wireline logging system of FIG. 2, according to one or more aspects of the present disclosure. The data processing systems 45 and 50 discussed above with reference to FIGS. 1 and 2 may take a form similar to the information handling system 300. A processor or central processing unit (CPU) 301 of the information handling system 300 is communicatively coupled to a memory controller hub (MCH) or north bridge 302. The processor 301 may include, for example a microprocessor, microcontroller, digital signal processor (DSP), application specific integrated circuit (ASIC), or any other digital or analog circuitry configured to interpret and/or execute program instructions and/or process data. Processor 301 may be configured to interpret and/or execute program instructions or other data retrieved and stored in any memory such as memory 304 or hard drive 307. Program instructions or other data may constitute portions of a software or application, for example application 358 or data 354, for carrying out one or more methods described herein. Memory 304 may include read-only memory (ROM), random access memory (RAM), solid state memory, or disk-based memory. Each memory module may include any system, device or apparatus configured to retain program instructions and/or data for a period of time (for example, non-transitory computer-readable media). For example, instructions from a software or application 358 or data 354 may be retrieved and stored in memory 304 for execution or use by processor 301. In one or more aspects, the memory 304 or the hard drive 307 may include or comprise one or more non-transitory executable instructions that, when executed by the processor 301 cause the processor 301 to perform or initiate one or more operations or steps. The information handling system 300 may be preprogrammed or it may be programmed (and reprogrammed) by loading a program from another source (for example, from a CD-ROM, from another computer device through a data network, or in another manner).

The data 354 may include treatment data, geological data, fracture data, seismic or micro seismic data, or any other appropriate data. In one or more aspects, a memory of a computing device includes additional or different data, application, models, or other information. In one or more aspects, the data 354 may include geological data relating to one or more geological properties of the subterranean formation (for example, formation 18 shown in FIG. 1). For example, the geological data may include information on the wellbore, completions, or information on other attributes of the subterranean formation. In one or more aspects, the geological data includes information on the lithology, fluid content, stress profile (for example, stress anisotropy, maximum and minimum horizontal stresses), pressure profile, spatial extent, or other attributes of one or more rock formations in the subterranean zone. The geological data may include information collected from well logs, rock samples, outcroppings, seismic or microseismic imaging, or other data sources.

The one or more applications 358 may comprise one or more software applications, one or more scripts, one or more programs, one or more functions, one or more executables, or one or more other modules that are interpreted or executed by the processor 301. The one or more applications 358 may include one or more machine-readable instructions for performing one or more of the operations related to any one or more aspects of the present disclosure. The one or more applications 358 may include machine-readable instructions for processing and visualization of resistivity data, as illustrated in FIGS. 4-9. The one or more applications 358 may obtain input data, such as seismic data, well data, treatment data, geological data, fracture data, or other types of input data, from the memory 304, from another local source, or from one or more remote sources (for example, via the one or more communication links 314). The one or more applications 358 may generate output data and store the output data in the memory 304, hard drive 307, in another local medium, or in one or more remote devices (for example, by sending the output data via the communication link 314).

Modifications, additions, or omissions may be made to FIG. 3 without departing from the scope of the present disclosure. For example, FIG. 3 shows a particular configuration of components of information handling system 300. However, any suitable configurations of components may be used. For example, components of information handling system 300 may be implemented either as physical or logical components. Furthermore, in one or more aspects, functionality associated with components of information handling system 300 may be implemented in special purpose circuits or components. In other aspects, functionality associated with components of information handling system 300 may be implemented in configurable general purpose circuit or components. For example, components of information handling system 300 may be implemented by configured computer program instructions.

Memory controller hub 302 may include a memory controller for directing information to or from various system memory components within the information handling system 300, such as memory 304, storage element 306, and hard drive 307. The memory controller hub 302 may be coupled to memory 304 and a graphics processing unit (GPU) 303. Memory controller hub 302 may also be coupled to an I/O controller hub (ICH) or south bridge 305. I/O controller hub 305 is coupled to storage elements of the information handling system 300, including a storage element 306, which may comprise a flash ROM that includes a basic input/output system (BIOS) of the computer system. I/O controller hub 305 is also coupled to the hard drive 307 of the information handling system 300. I/O controller hub 305 may also be coupled to an I/O chip or interface, for example, a Super I/O chip 308, which is itself coupled to several of the I/O ports of the computer system, including a keyboard 309, a mouse 310, a monitor 312 and one or more communications link 314. Any one or more input/output devices receive and transmit data in analog or digital form over one or more communication links 314 such as a serial link, a wireless link (for example, infrared, radio frequency, or others), a parallel link, or another type of link. The one or more communication links 314 may comprise any type of communication channel, connector, data communication network, or other link. For example, the one or more communication links 314 may comprise a wireless or a wired network, a Local Area Network (LAN), a Wide Area Network (WAN), a private network, a public network (such as the Internet), a wireless fidelity or WiFi network, a network that includes a satellite link, or another type of data communication network.

A key challenge in determining properties of a formation proximate to a wellbore is interpretation of log data collected by logging tools such as an LWD tool (for example, LWD tool 26 as shown in FIG. 1). Accurate interpretation of log data may provide indications of hydrocarbon concentrations and other information useful to drillers and completion engineers. In particular, interpreting azimuthally-sensitive logs may provide information useful for steering a drilling assembly towards hydrocarbon deposits.

Existing logging systems typically generate various illustrations including plots and images based on the collected log data for viewing on a display device to aid in interpretation of the log data by a user. For example, plots of one or more formation properties such as resistivity, gamma, porosity and density may be generated as a function of depth and/or position. The depth may be a true vertical depth (TVD) or a measured depth (MD) and the position may be a spatial position with respect to a wellhead. Other variations in illustration are also possible. A user may view and interpret these illustrations on a display device (for example, a display of a computer system related to a logging environment) in order to quantitatively analyze the formation properties proximate to the wellbore.

Azimuthal data such as azimuthal resistivity data can be valuable in evaluation of subterranean formations. A comprehensive geological analysis of a formation (for example, formation 18 as shown in FIG. 1) proximate to a wellbore requires an interpretation of azimuthal resistivity data for a clear understanding of resistivity field surrounding the wellbore. Interpreting illustrations based on azimuthal resistivity data related to downhole formations (for example, obtained from LWD, MWD, and/or wireline logging applications) generated based on current data evaluation and illustration techniques can be very challenging. Traditional illustrations of azimuthal resistivity data do not include clear and easy to interpret visual representations of resistivity distribution of a formation around the wellbore at selected depths (for example, a selected measured depth) of the wellbore. A user generally needs to interpret such information based on a combination of plots and images presented on a display device. Thus, current techniques for evaluation and illustration of azimuthal resistivity data may generally involve considerable time and effort in the user interpretation of the resistivity distribution around the wellbore. Further, such interpretations may be prone to errors in interpretation as a result of the complexities involved in interpreting traditional resistivity illustrations. Thus, current systems may involve increased time, cost and risk burden. For example, a user may take erroneous steering decisions based on an erroneous interpretation of resistivity field around the wellbore.

Aspects of the present disclosure provide improved techniques for processing and visualizing azimuthal resistivity data relating to formations proximate to a wellbore. One or more aspects provide techniques for generating a rose diagram representing resistivity field in a cross-section perpendicular to a wellbore at a selected measured depth. The rose diagram, when rendered and displayed on a display device, visually shows a clear representation of the resistivity field around the wellbore at the measured depth. One or more aspects provide techniques for generating a three-dimensional resistivity model of the wellbore based on a plurality of rose diagrams generated for different measured depths along the wellbore. The three-dimensional resistivity model is a comprehensive illustration of the distribution of resistivity values of the formation surrounding the wellbore along the entire length of the wellbore.

The techniques for processing and visualizing azimuthal resistivity data as discussed in accordance with aspects of the present disclosure provide several advantages over current techniques. For example, a clear visual representation of the resistivity field around the wellbore at selected depths of the wellbore allows a user to quickly and accurately interpret the azimuthal resistivity data and make accurate geosteering decisions. Even complex geological scenarios may be accurately interpreted with minimal effort. This may minimize time, costs and risks related to such systems. Further, the clear representation of the resistivity field around the wellbore helps reduce uncertainties typically associated with the resistivity field to the side of the wellbore.

In addition, by generating representations of the resistivity fields surrounding the wellbore at selected depths as well as along the entire length of the wellbore, these techniques allow for a more comprehensive analysis of the azimuthal resistivity field leading to increased knowledge and understanding of the resistivity field proximate to the wellbore.

In certain aspects, for purposes of resistivity data collection and analysis in accordance with aspects of the present disclosure, an inner circumference of the wellbore may be conceptually divided into a preconfigured number of azimuthal sections or bins, where each bin corresponds to a direction or a range of directions from the wellbore into the formation proximate to the wellbore. The resistivity data associated with each bin is measured in the direction or the range of directions associated with each bin. For each of the bins resulting from this division, the logging tool (for example, logging tool 26 or logging tool 34) may provide multiple measurements in the corresponding one or more directions. In one or more aspects, the number of bins into which the resistivity data is divided is a function of a selected azimuthal resolution around the wellbore. For example, the resistivity data may be divided into 8, 16, 32, 128 bins, or any other suitable value.

Figures 4A, 4B:
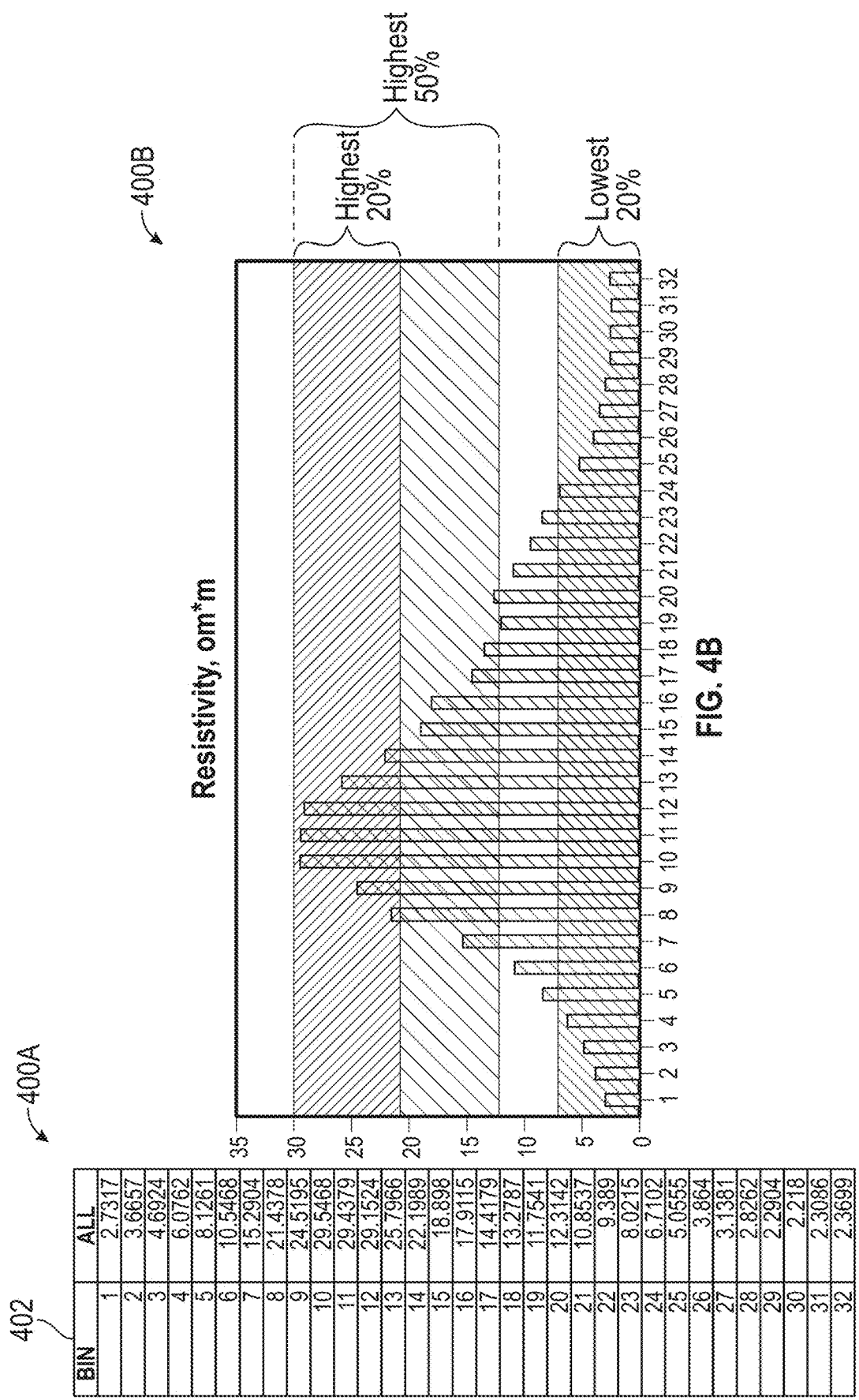
FIG. 4A illustrates an example data set of azimuthal resistivity data for a selected depth of a wellbore, in accordance with one or more aspects of the present disclosure.
FIG. 4B illustrates a plot of the resistivity data, in accordance with one or more certain aspects of the present disclosure.

FIG. 4A illustrates an example data set 400A of azimuthal resistivity data for a selected depth of a wellbore, in accordance with one or more aspects of the present disclosure. FIG. 4B illustrates a plot 400B of the resistivity data of FIG. 4A, in accordance with one or more aspects of the present disclosure. As shown in FIGS. 4A and 4B, the resistivity data (for example, as collected by a logging tool) is divided into 32 bins 402 (shown on the horizontal axis in plot 400B). The resistivity data corresponding to each bin includes a numerical value of resistivity (recorded in ohm meters (ohm-m) as shown on the vertical axis in plot 400B) which corresponds to the resistivity field of the formation proximate to the wellbore in the one or more directions associated with the bin. Thus, the data shown in FIGS. 4A and 4B includes a distribution of resistivity values around the wellbore at one selected depth (for example, measured depth) of the wellbore.

In certain aspects, in order to illustrate the resistivity field of the formation around the wellbore at a selected depth (for example, measured depth) of the wellbore, a rose diagram may be generated based on resistivity data collected at the selected depth.

FIG. 5 illustrates an example rose diagram 500 generated based on the resistivity data from FIGS. 4A and 4B, in accordance with one or more aspects of the present disclosure. As shown, rose diagram 500 includes a circle 502 having a preconfigured radius, where the center of the circle represents the wellbore. The circle 502 is divided into a preconfigured number of sectors 506. The preconfigured number of sectors of the circle 502 may comprise one or more sectors 504. In one or more aspects, the preconfigured number of sectors 506 equals the number of bins 402 into which the resistivity data is divided, where each bin is represented by a corresponding sector of the rose diagram. As shown in FIG. 5, the rose diagram is divided into 32 sectors 504, where each of the 32 sectors 504 represents a corresponding one of the 32 bins of resistivity data from FIGS. 4A and 4B. In one or more aspects, the top side of the rose diagram which aligns with bin 1 from FIG. 4A represents the high side of the logging tool oriented along the wellbore. The circumference of the rose diagram 500 represents a 360-degree field of view around the wellbore, where each sector, bin, or both of the rose diagram represents measurements taken in corresponding one or more directions with reference to the logging tool high side.

In one or more aspects, generating the rose diagram includes plotting the resistivity data on to the rose diagram based on a logarithmic scale 510. In an aspect, the logarithmic scale extends radially outward from the center of the circle 502 such that one or more resistivity values associated with the resistivity data increase from the center to the circumference of the circle 502. That is, the center of the circle 502 represents a numerical resistivity value of 0 ohm-m and the circumference of the circle 502 represents the highest numerical resistivity value. In one or more aspects, the highest numerical resistivity value on the logarithmic scale may be a highest resistivity value recorded for all bins across the length of the wellbore, the highest resistivity value recorded for the selected measured depth of the wellbore, or some other configurable value. As shown in FIG. 5, the resistivity value associated with each of the bins shown in FIGS. 4A and 4B is plotted on to a corresponding sector representing the bin by shading the sector, where a radial length of a shaded region of the sector is a function of a corresponding numerical resistivity value for the bin. As shown, a higher numerical resistivity value translates into a larger radial length of the shaded region. Thus, once the resistivity data is plotted based on the logarithmic scale 510, the rose diagram 500 has a variable radius around the circumference of the rose diagram, were the radius at each point on the circumference of the rose diagram is a function of a numerical resistivity value plotted to a sector that includes the point on the circumference.

In one or more aspects, to further enhance the illustration of the rose diagram, the resistivity data may additionally be plotted based on a color scale. In an aspect, the color scale, for example, a grayscale, extends radially outwards from the center of the circle 502 such that each color visually represents a range of the one or more resistivity values. For example, a first color may represent a lowest resistivity value at the center of the circle 502 and a second color may represent a highest resistivity value at or near the circumference of the circle 502. In one or more aspects, each range of resistivity values may be assigned a different color, where the colors assigned to a sector, bin or both of the rose diagram may visually transition radially outward from the first color representing the lowest range of resistivity values at the center of the circle 502 to a second color representing the highest range of resistivity values associated with the bin including any intermediate colors corresponding to other ranges of values in between the lowest and the highest range of values for the bin.

In an aspect, the rose diagram 500 generated in the manner discussed above may be rendered for display on a display device. As shown in FIG. 5, by plotting the resistivity data as a rose diagram in the manner discussed above, a clear visual representation is created of the resistivity field in a 360-degree field of view around the wellbore at the selected depth of the wellbore. In one or more aspects, the rose diagram 500 displays the resistivity data in a cross-section perpendicular to the wellbore at the selected depth of the wellbore.

As may be appreciated from the discussion of FIG. 5, the rose diagram 500 is a clear visual representation of the resistivity field around the wellbore at a single depth of the wellbore. This clear visual representation of the resistivity field may reduce time, costs and risks associated with interpreting resistivity data. Further, the clear visual representation may help reduce uncertainties typically associated with the resistivity field to the side of the wellbore.

In one or more aspects, the resistivity data collected for a selected measured depth may be filtered based, at least in part, on one or more criteria and a rose diagram may be generated based, at least in part, on the filtered resistivity data.

FIG. 6A illustrates an example filtered data set 600A including one or more filtered resistivity data subsets of the resistivity data from FIG. 4A, in accordance with one or more aspects of the present disclosure. As shown, the filtered data set 600A includes filtered data subsets 602, 604 and 606 corresponding to the lowest 20% of the resistivity values, highest 50% of the resistivity values and highest 20% of the resistivity values respectively. FIG. 4B illustrates these filtered resistivity values. In one or more aspects, the filtering may be configured by the user. For example, the filtering may be configured to filter out any percentage value of the lowest or highest resistivity values.

FIG. 6B illustrates an example rose diagram 600B representing the lowest 20% resistivity values of the resistivity data from FIG. 6A, in accordance with one or more aspects of the present disclosure. As shown, only resistivity values from bins 1-3 and 25-32 which make up the lowest 20% of the resistivity values of the resistivity data from FIG. 6A have been plotted on the rose diagram 600B.

FIG. 6C illustrates an example rose diagram 600C representing the highest 50% resistivity values of the resistivity data from FIG. 6A, in accordance with one or more aspects of the present disclosure. As shown, only resistivity values from bins 7-18 which make up the highest 50% of the resistivity values of the resistivity data from FIG. 6A have been plotted on the rose diagram 600C.

FIG. 6D illustrates an example rose diagram 600D representing the highest 20% resistivity values of the resistivity data from FIG. 6A, in accordance with one or more aspects of the present disclosure. As shown, only resistivity values from bins 8-14 which make up the highest 20% of the resistivity values of the resistivity data from FIG. 6A have been plotted on the rose diagram 600D.

As may be appreciated from FIGS. 6B-6D, the rose diagrams 600B, 600C and 600D visually represent formations proximate to the wellbore at the same selected depth of the wellbore as a function of different resistivity value ranges. Such filtered representations may be useful in certain applications. For example, a user may filter the resistivity data in order to view one or more portions of the formation around the wellbore having the highest 20% resistivity values and may steer a drilling tool in a direction of one of those one or more portions indicated as having the high resistivity values.

In certain aspects, one or more rose diagrams may be rendered for displaying simultaneously with one or more other images and/or plots that are generated based on known techniques based on several properties of the formation proximate the wellbore.

Figure 7:
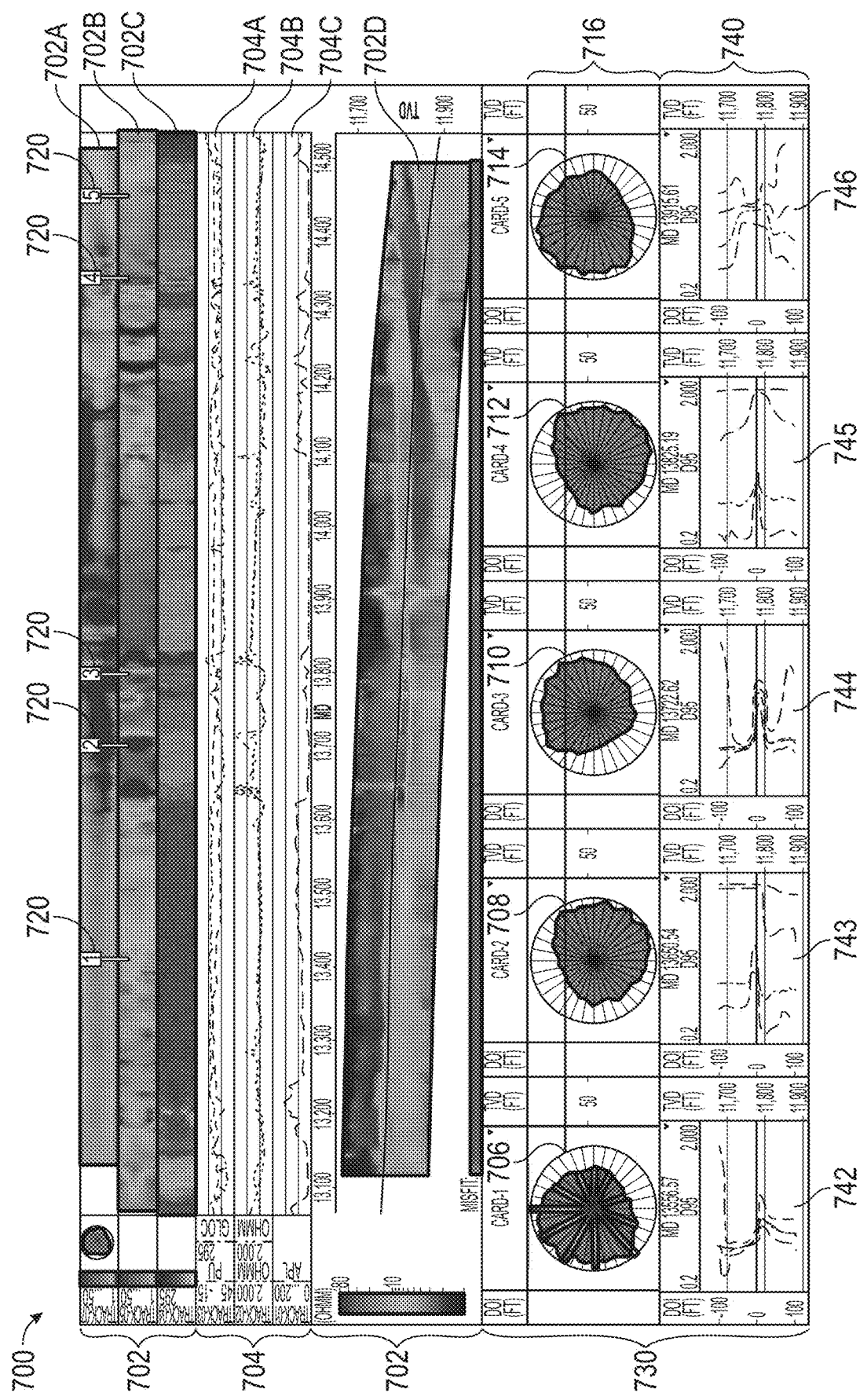
FIG. 7 illustrates an integrated display that includes several images and data logs related to a formation proximate to a wellbore, in accordance with one or more aspects of the present disclosure.

FIG. 7 illustrates an integrated display 700 that includes several images and data logs related to a formation proximate to a wellbore, in accordance with one or more aspects of the present disclosure. As shown, the integrated display 700 includes a plurality of image logs 702 and a plurality of curve plots 704 corresponding to one or more properties of the formation proximate to a wellbore. As shown, the image logs 702 as displayed on the integrated display 700 include a first resistivity image log 702A along the length of the wellbore based on azimuthal resistivity data collected by an ultra-deep resistivity tool, a second resistivity image log 702B along the length of the wellbore based on azimuthal resistivity data collected by a deep resistivity tool, a third azimuthal density image log 702C along the length of the wellbore based on azimuthal density data collected by an azimuthal lithodensity tool, and a fourth image log 702D of a well section window with target well path and one dimensional (1D) resistivity inversion display along the length of the wellbore. The curve plots 704, as shown on the integrated display 700 includes a first curve plot 704A displaying neutron porosity and average bulk density curves, a second curve plot 704B displaying average resistivity curves from an azimuthal resistivity tool, a third curve plot 704C displaying a gamma ray curve from a gamma ray tool. As shown, the integrated display 700 further includes card views 730 shown as Cards 1-5. Each of the Cards 1-5 includes a rose diagram 716 and distribution curves (D-curves) 740 from the 1D inversion at the well section window. For example, Card 1 displays rose diagram 706 and D-curves 742, Card 2 displays rose diagram 708 and D-curves 743, Card 3 displays rose diagram 710 and D-curves 744, Card 4 displays rose diagram 712 and D-curves 745 and Card 5 displays rose diagram 714 and D-curves 746. Each of the D-curves 740 represents the results of the 1D resistivity inversion at a single depth of the wellbore. In one or more aspects, the fourth image log 702D displaying 1D resistivity inversion and the D-curves 740 allow the user to analyze the resistivity field above and below the wellbore TVD at selected depths of the wellbore. A rose diagram 716 and D-curves 740 displayed within the same corresponding Card 1-5 are plotted for the same depth of the wellbore. Each of the rose diagrams 706, 708, 710, 712 and 714 displayed in card views 730 represent azimuthal resistivity data measurements from an ultra-deep resistivity tool at a single depth of the wellbore.

As may be appreciated from the integrated display 700, image logs 702 and the curve plots 704 are not straightforward to read and interpret. For example, the first resistivity image log 702A and the second resistivity curve plot 704B, individually or in combination, are not straightforward to read and interpret. Thus, it may take a user considerable amount of skill, time and effort in order to accurately determine the resistivity field around the wellbore.

In one or more aspects, one or more rose diagrams generated in accordance with techniques discussed above may be used to supplement the image logs 702 and curve plots 704. For example, each of the rose diagrams 706, 708, 710, 712 and 714 displayed in card views 730 shown as Card 1-Card 5 respectively represents the resistivity data in a cross-section perpendicular to the wellbore at a different measured depth of the wellbore. In one or more aspects, the total number of rose diagrams to generate for display and the associated measured depths of the wellbore may be preconfigured or specified by a user. In one or more aspects, a visual marker 720 may be generated for each of the displayed rose diagrams 716 and displayed on the first resistivity image log 702A at corresponding measured depths. For example, a visual marker 720 corresponding to each of the rose diagrams 706, 708, 710, 712 and 714 may be displayed on the first resistivity image log 702A at the corresponding measured depths of the associated rose diagrams 716. Each visual marker 720 may serve as an indicator of which measured depths along the wellbore have corresponding rose diagrams 716 available for display in the card views 730. In an aspect, each visual marker 720 may be assigned the same serial number as the serial number of the card view 730 that displays the corresponding rose diagram 716. For example, the plurality of visual markers 720 are assigned serial numbers 1-5 that match the serial numbers 1-5 respectively of the corresponding card views 730.

In one or more aspects, additionally or alternatively, a user may select any one of the plurality of visual markers 720 to cause the computer system to display the corresponding rose diagram 716 on either side of the first resistivity log 702A. For example, a rose diagram 716 may be displayed on the left of the first resistivity image log 702A.

In one or more aspects, rose diagrams 716, for example, rose diagrams 706, 708, 710, 712 and 714, allow a user to have a more comprehensive picture of the resistivity field around the wellbore. For example, the rose diagrams 716 in combination with the first resistivity image log 702A and first resistivity curve plot 704A may allow the user to interpret the resistivity logs relatively quickly and accurately as compared to interpreting the resistivity logs based only on the first resistivity image log 702A and the first resistivity curve plot 704A. Additionally or alternatively, the card views displaying the rose diagrams 716 and the D-curves 740 provide the user with a comprehensive visual representation of resistivity fields at selected measured depths, thus allowing the user to interpret the resistivity fields to the side of the wellbore with minimized effort and a higher degree of accuracy as compared to traditional logging displays. For example, the rose diagrams 716 and the D-curves 740 allows the user to perform a more comprehensive analysis of the resistivity field around the wellbore. The D-curves 740 provide information relating to resistivity values above and below the wellbore and the rose diagrams 716 provide information of the resistivity field in a 360-degree field around the wellbore including the resistivity field to the side of the wellbore. Such information may allow the user to quickly make a decision regarding steering the drilling tool towards parts of the formation having the richest hydrocarbon deposits often referred to as the "Sweet Spot".

In one or more aspects, a plurality of rose diagrams 716 may be combined to generate a three-dimensional resistivity model of the wellbore that illustrates a resistivity distribution around the wellbore along the length of the wellbore. In one or more aspects, a plurality of data points may be identified along the length of the wellbore, where each data point corresponds to a different measured depth of the wellbore. A rose diagram may be generated for each of the data points and a three-dimensional resistivity model of the wellbore may be generated based on the generated rose diagrams. In one or more aspects, in order to generate the three-dimensional resistivity model resistivity data is extrapolated between two consecutive data points based on the corresponding rose diagrams. A number, density or both of data points along a wellbore may be selected based on a selected resolution.

FIG. 8A illustrates an example generation of a resistivity model based on a plurality of rose diagrams at a plurality of measured depths along the wellbore, in accordance with one or more aspects of the present disclosure.

As shown in FIG. 8A each of the rose diagrams 802, 804, 806 and 808 represent resistivity fields in a cross-section perpendicular to the wellbore 820 at a plurality of measured depths along the wellbore. As described above, each of the rose diagrams 802, 804, 806 and 808 has a variable radius circumference, were a higher resistivity value is represented by a larger radius and a lower resistivity value is represented by a shorter radius. Further, as described above, different colors may be used to represent different ranges of resistivity values. The data from the rose diagrams may be combined as described above to generate a three-dimensional resistivity model of the wellbore.

In one or more aspects, the three-dimensional resistivity model includes a cylinder along the length of the wellbore with a central axis of the cylinder representing the well bore. In one or more aspects, resistivity values of the formation for a given or selected measured depth and selected bin are visually represented by a distance of a corresponding portion of the surface of the cylinder from its central axis, a color or shading of the corresponding portion of the surface of the cylinder and any combination thereof.

FIG. 8B illustrates a three-dimensional resistivity model 800B of a wellbore generated based on one or more rose diagrams, in accordance with one or more aspects of the present disclosure. As shown, the resistivity model 800B is in the shape of a variable radius cylinder 802 with the central axis 804 of the cylinder 802 representing the wellbore. In one or more aspects, the distance between a portion of the surface of the cylinder 802 and the central axis of the cylinder 802 (for example, the radius of the portion of the surface of the cylinder 802) is a function of a plurality of resistivity values from one or more rose diagrams that are closest to the portion of the surface of the cylinder 802. For example, for a given or selected measured depth and bin, the distance from the central axis of a portion of the surface of the cylinder 802 representing the measured depth and the bin is a function of one or more resistivity values corresponding to the same bin from one or more rose diagrams nearest to the portion of the surface of the cylinder 802. This means that the surface of the three-dimensional cylinder 802 generally follows the circumferences of the one or more rose diagrams used to generate the resistivity model, where a first one or more portions of the cylinder 802 representing higher resistivity values have larger radiuses and a second one or more portions of the cylinder 802 representing lower resistivity values have smaller radiuses.

In one or more aspects, additionally or alternatively, one or more resistivity values in the three-dimensional resistivity model may be represented by assigning different colors or shading to different ranges of resistivity values. For example, lighter colors or shading may represent smaller resistivity values and darker colors or shading may represent higher resistivity values. In one or more aspects, in order to assign a color or shading to a portion of the surface of the cylinder 802, the one or more resistivity values represented by the portion of the surface of the cylinder 802 may be compared to a threshold resistivity value. A first color may be assigned to a first one or more resistivity values that equal or exceed the threshold and a second color may be assigned to a second one or more resistivity values that are below the threshold. In one or more aspects, additionally or alternatively, the resistivity model 800B may illustrate a surface boundary 810.

In one or more aspects, multiple measurement tools may be used within a wellbore in order to provide the user different types of information relating to geology and fluid saturation surrounding the wellbore. For example, the BHA may include several azimuthal tools with different depths of investigation and types of measurements. In one or more aspects, in order to facilitate a more comprehensive analysis of the geology surrounding the wellbore, in addition to plotting azimuthal resistivity data collected by an azimuthal resistivity tool on a rose diagram as described above, additional data from one or more other tools may also be plotted on the rose diagram.

Figure 9:
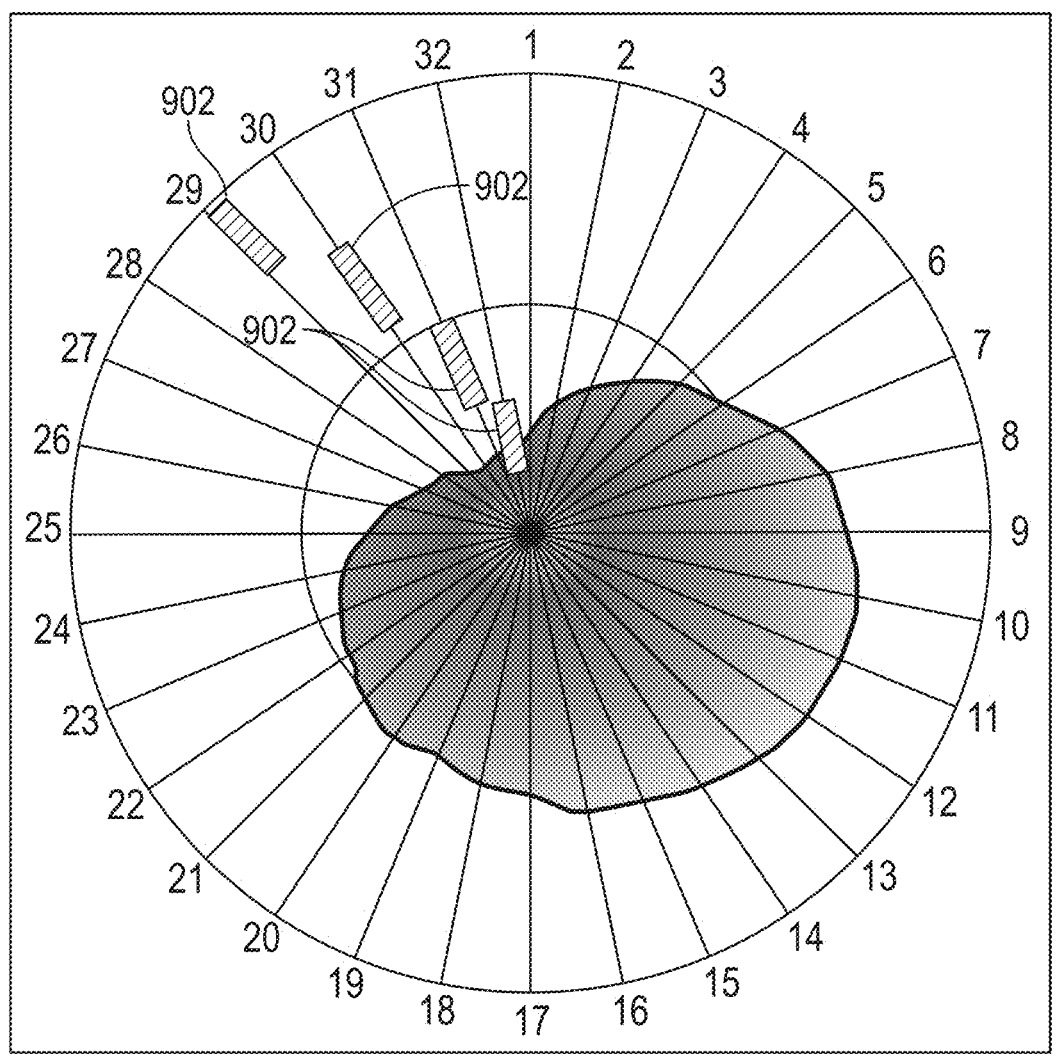
FIG. 9 illustrates the rose diagram of FIG. 5 with additional plotted data, in accordance with one or more aspects of the present disclosure.

FIG. 9 illustrates the rose diagram of FIG. 5 with additional plotted data, in accordance with one or more aspects of the present disclosure. The rose diagram 900 plots geosignal measurement data on the same rose diagram that plots azimuthal resistivity data. The geosignal measurements provide information relating to conductivity of the formation surrounding the wellbore. The rectangles 902 shown on the rose diagram 900 represent geosignal measurements in directions relative to the wellbore in which the formation surrounding the wellbore has the highest conductivity (that is, lowest resistivity). Each of the rectangles 902 represents a geosignal measurement for a different combination of spacing and frequency. Thus, by providing information regarding the conductivity field as well as the resistivity field around the wellbore, the rose diagram provides more information relating to the resistivity field around the wellbore. For example, based on the rose diagram 900, the user may compare the resistivity data and conductivity data and determine if they match, allowing the user to determine the resistivity field around the wellbore with a higher degree of accuracy.

Figure 10:
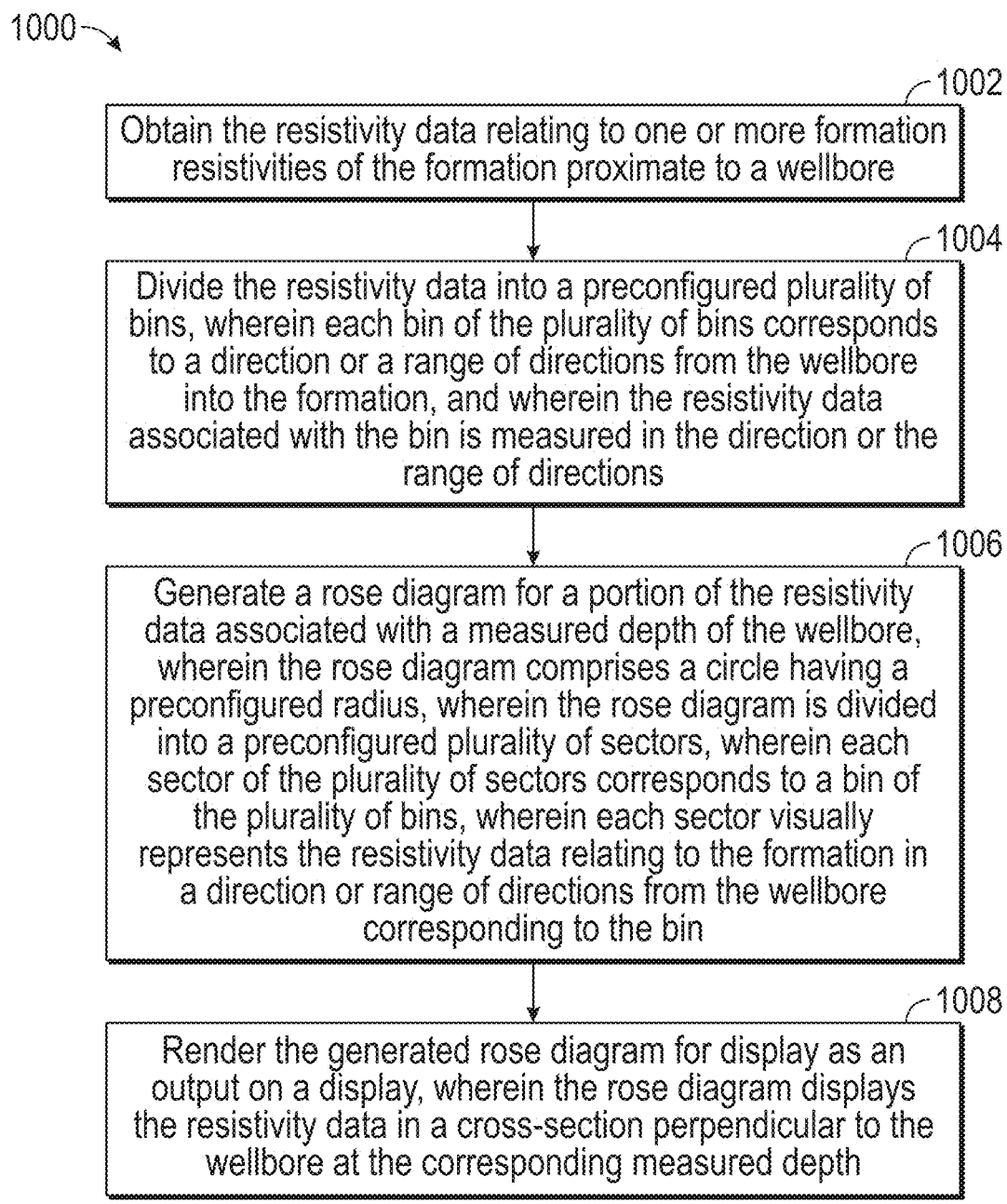
FIG. 10 illustrates example operations that may be performed by a data processing system (for example, data processing systems 45 and 50) for processing resistivity data associated with a formation, in accordance with one or more aspects of the present disclosure.

FIG. 10 illustrates example operations 1000 that may be performed by a data processing system (for example, data processing systems 45 and 50) for processing resistivity data associated with a formation, in accordance with certain aspects of the present disclosure.

Operations 1000 begin, at 1002 by obtaining the resistivity data relating to one or more formation resistivities of the formation proximate to a wellbore.

At 1004, the resistivity data is divided into a preconfigured plurality of bins, wherein each bin of the plurality of bins corresponds to a direction or a range of directions from the wellbore into the formation, and wherein the resistivity data associated with the bin is measured in the direction or the range of directions.

At 1006, a rose diagram is generated for a portion of the resistivity data associated with a measured depth of the wellbore, wherein the rose diagram comprises a circle having a preconfigured radius, wherein the rose diagram is divided into a preconfigured plurality of sectors, wherein each sector of the plurality of sectors corresponds to a bin of the plurality of bins, wherein each sector visually represents the resistivity data relating to the formation in a direction or range of directions from the wellbore corresponding to the bin.

At 1008, the generated rose diagram is rendered for display as an output on a display, wherein the rose diagram displays the resistivity data in a cross-section perpendicular to the wellbore at the corresponding measured depth. In one or more aspects, the rose diagram has a variable radius as a function of the resistivity values.

In one or more aspects, any one or more of operations 1000 may be performed in any order or not all.

In one or more aspects, the generating the rose diagram comprises plotting the resistivity data for each bin of the plurality of bins into a corresponding sector of the plurality of sectors of the rose diagram based on a logarithmic scale that extends radially outward from the center of the circle such that one or more resistivity values associated with the resistivity data increase from the center to the circumference of the circle; and plotting the resistivity data for each bin of the plurality of bins into the corresponding sector based on a color scale that extends radially outwards from the center of the circle such that each color visually represents a range of the one or more resistivity values, wherein a first color represents a lowest resistivity value at the center and a second color represents a highest resistivity value near the circumference of the circle.

In one or more aspects, operations 1000 further include generating a visual marker corresponding to the generated rose diagram; and rendering the visual marker as superimposed on a track image of the resistivity data along the length of the wellbore, wherein the visual marker is superimposed on the track image at a point that represents the measured depth corresponding to the rose diagram to visually indicate that the rose diagram is generated for the measured depth of the wellbore.

In one or more aspects, the rose diagram and the track image are displayed simultaneously on the display.

In one or more aspects, operations 1000 further include filtering the resistivity data for the measured depth as a function of a plurality of resistivity values associated with the resistivity data or a range of resistivity values associated with the resistivity data; and generating a rose diagram based on the filtered resistivity data.

In one or more aspects, the filtering comprises filtering out a preselected percentage of the highest resistivity values, a preselected percentage of the lowest resistivity values or a combination thereof. In one or more aspects, the filtering may be configured by the user. For example, the filtering may be configured to filter out any percentage value of the lowest or highest resistivity values.

In one or more aspects, operations 1000 further include obtaining a plurality of data points along the wellbore, wherein each data point of the plurality of data points corresponds to a different measured depth along the wellbore; generating a plurality of rose diagrams for the plurality of data points; generating a three-dimensional resistivity model of the wellbore based on the plurality of rose diagrams by extrapolating the resistivity data between two consecutive data points of the plurality of data points based on a corresponding rose diagram of the plurality of rose diagrams; and rendering the resistivity model for display on the display.

In one or more aspects, the resistivity model includes a cylinder along the length of the wellbore with a central axis of the cylinder representing the wellbore, wherein a plurality of resistivity values associated with the resistivity data around the wellbore at a measured depth are visually represented by at least one of a distance of a corresponding portion of the surface of the cylinder from its central axis or a color of the corresponding portion of the surface of the cylinder.

In one or more aspects, the cylinder has a variable radius and wherein a distance of a portion of a surface of the cylinder from a central axis of the cylinder at any point along the length of the cylinder is determined by a magnitude of the plurality of resistivity values from a rose diagram of the plurality of rose diagrams nearest to the portion along the central axis.

In one or more aspects, the plurality of resistivity values at any point along the length of the wellbore are visually represented by at least one color that corresponds to a portion of the surface of the cylinder, wherein assigning the at least one color to the portion of the surface of the cylinder comprises: comparing the plurality of resistivity values to a threshold; assigning at least one first color to a first one or more resistivity values of the plurality of resistivity values in response to detecting that the first one or more resistivity values equal or exceed the threshold; and assigning at least one second color to a second one or more resistivity values of the plurality of resistivity values in response to detecting that the second one or more resistivity values are below the threshold.

In one or more aspects, operations 1000 further include receiving a user selection of the measured depth.

In one or more aspects, the preconfigured plurality of bins comprises 8 bins, 16 bins, 32 bins or 128 bins.

In one or more aspects, the resistivity data comprises azimuthal resistivity data.

In one or more aspects of the present disclosure provide an apparatus for processing resistivity data associated with a formation. The apparatus generally includes a non-transitory storage medium and at least one processor coupled to the non-transitory storage medium. The at least one processor executes one or more instructions stored on the non-transitory storage medium to: obtain the resistivity data relating to one or more formation resistivities of the formation proximate to a wellbore; divide the resistivity data into a preconfigured plurality of bins, wherein each bin of the plurality of bins corresponds to a direction or a range of directions from the wellbore into the formation, and wherein the resistivity data associated with the bin is measured in the direction or the range of directions; generate a rose diagram for a portion of the resistivity data associated with a measured depth of the wellbore, wherein the rose diagram comprises a circle having a preconfigured radius, wherein the rose diagram is divided into a preconfigured plurality of sectors, wherein each sector of the plurality of sectors corresponds to a bin of the plurality of bins, wherein each sector visually represents the resistivity data relating to the formation in a direction or range of directions from the wellbore corresponding to the bin; and render the generated rose diagram for display as an output on a display, wherein the rose diagram displays the resistivity data in a cross-section perpendicular to the wellbore at the corresponding measured depth.

In one or more aspects, the at least one processor is configured to: plot the resistivity data for each bin of the plurality of bins into a corresponding sector of the plurality of sectors of the rose diagram based on a logarithmic scale that extends radially outward from the center of the circle such that one or more resistivity values associated with the resistivity data increase from the center to the circumference of the circle; and plot the resistivity data for each bin of the plurality of bins into the corresponding sector based on a color scale that extends radially outwards from the center of the circle such that each color visually represents a range of the one or more resistivity values, wherein a first color represents a lowest resistivity value at the center and a second color represents a highest resistivity value near the circumference of the circle.

In one or more aspects, the at least one processor is further configured to: obtain a plurality of data points along the wellbore, wherein each data point corresponds to a different measured depth along the wellbore; generate a plurality of rose diagrams for the plurality of data points; generate a three-dimensional resistivity model of the wellbore based on the plurality of rose diagrams by extrapolating the resistivity data between two consecutive data points of the plurality of data points based on corresponding rose diagrams; and render the resistivity model for display on the display.

In one or more aspects, the resistivity model includes a cylinder along the length of the wellbore with a central axis of the cylinder representing the well bore, wherein a plurality of resistivity values associated with the resistivity data around the wellbore at a measured depth are visually represented by at least one of a distance of a corresponding portion of a surface of the cylinder from its central axis or a color of the corresponding portion of the surface of the cylinder.

In one or more aspects of the present disclosure provide a non-transitory computer-readable medium storing one or more instructions that, when executed by at least one processor, cause the at least one processor to perform one or more operations comprising: obtaining resistivity data relating to one or more formation resistivities of a formation proximate to a wellbore; dividing the resistivity data into a preconfigured plurality of bins, wherein each bin of the plurality of bins corresponds to a direction or a range of directions from the wellbore into the formation, and wherein the resistivity data associated with the bin is measured in the direction or the range of directions; generating a rose diagram for a portion of the resistivity data associated with a measured depth of the wellbore, wherein the rose diagram comprises a circle having a preconfigured radius, wherein the rose diagram is divided into a preconfigured plurality of sectors, wherein each sector of the plurality of sectors corresponds to a bin of the plurality of bins and visually represents the resistivity data relating to the formation in a direction or range of directions from the wellbore corresponding to the bin; and rendering the generated rose diagram for display as an output on a display, wherein the rose diagram displays the resistivity data in a cross-section perpendicular to the wellbore at the corresponding measured depth.

In one or more aspects, the generating the rose diagram comprises: plotting the resistivity data for each bin of the plurality of bins into a corresponding sector of the plurality of sectors of the rose diagram based on a logarithmic scale that extends radially outward from the center of the circle such that one or more resistivity values associated with the resistivity data increase from the center to the circumference of the circle; and plotting the resistivity data for each bin of the plurality of bins into the corresponding sector based on a color scale that extends radially outwards from the center of the circle such that each color visually represents a range of the one or more resistivity values, wherein a first color represents a lowest resistivity value at the center and a second color represents a highest resistivity value near the circumference of the circle.

In one or more aspects, the computer-readable medium further includes instruction for: obtaining a plurality of data points along the wellbore, wherein each data point corresponds to a different measured depth along the wellbore; generating a plurality of rose diagrams for the plurality of data points; generating a three-dimensional resistivity model of the wellbore based on the plurality of rose diagrams by extrapolating the resistivity data between two consecutive data points of the plurality of data points based on corresponding rose diagrams; and rendering the resistivity model for display on the display.

Therefore, the present disclosure is well adapted to attain the ends and advantages mentioned as well as those that are inherent therein. The particular aspects disclosed above are illustrative only, as the present disclosure may be modified and practiced in different but equivalent manners apparent to those skilled in the art having the benefit of the teachings herein. Furthermore, no limitations are intended to the details of construction or design herein shown, other than as described in the claims below. It is therefore evident that the particular illustrative aspects disclosed above may be altered or modified and all such variations are considered within the scope and spirit of the present disclosure. Also, the terms in the claims have their plain, ordinary meaning unless otherwise explicitly and clearly defined by the patentee. The indefinite articles "a" or "an," as used in the claims, are defined herein to mean one or more than one of the elements that it introduces.

What is claimed is:

1. A method for processing resistivity data associated with a formation, comprising:
    obtaining the resistivity data including numerical resistivity values of formation resistivities of the formation proximate to a wellbore using electromagnetic signals;
    dividing the resistivity data into a preconfigured plurality of bins, wherein each bin of the preconfigured plurality of bins corresponds to a direction or a range of directions from the wellbore into the formation, and wherein the resistivity data associated with each bin of the preconfigured plurality of bins comprises the numerical resistivity values measured in the direction or the range of directions;
    plotting on a rose diagram the numerical resistivity values collected at a measured depth of the wellbore, wherein the rose diagram comprises a circle having a preconfigured radius, wherein the rose diagram is divided into a preconfigured plurality of sectors, wherein each sector of the preconfigured plurality of sectors corresponds to a bin of the preconfigured plurality of bins, and wherein each sector of the preconfigured plurality of sectors visually illustrates the numerical resistivity values relating to the formation measured in the direction or the range of directions from the wellbore corresponding to the bin; and
    rendering the generated rose diagram for display as an output on a display, wherein the rose diagram displays a distribution of the resistivity values in a cross-section perpendicular to the wellbore at the measured depth.

2. The method of claim 1, wherein the plotting on the rose diagram comprises:
    plotting the resistivity data for each bin of the preconfigured plurality of bins into a corresponding sector of the plurality of sectors of the rose diagram based on a logarithmic scale that extends radially outward from the center of the circle such that one or more resistivity values associated with the resistivity data increase from the center to the circumference of the circle; and
    plotting the resistivity data for each bin of the preconfigured plurality of bins into the corresponding sector based on a color scale that extends radially outwards from the center of the circle such that each color visually represents a range of the one or more resistivity values, wherein a first color represents a lowest resistivity value at the center and a second color represents a highest resistivity value near the circumference of the circle.

3. The method of claim 1, further comprising:
    generating a visual marker corresponding to the rose diagram; and
    rendering the visual marker as superimposed on a track image of the resistivity data along a length of the wellbore, wherein the visual marker is superimposed on the track image at a point that represents the measured depth corresponding to the rose diagram to visually indicate that the rose diagram is generated for the measured depth of the wellbore.

4. The method of claim 3, wherein the rose diagram and the track image are displayed simultaneously on the display.

5. The method of claim 1, further comprising:
    filtering the resistivity data for the measured depth as a function of the one or more resistivity values associated with the resistivity data or a range of resistivity values associated with the resistivity data; and
    generating a rose diagram based on the filtered resistivity data.

6. The method of claim 5, wherein the filtering comprises filtering out a preselected percentage of at least one of a highest resistivity value or a lowest resistivity value.

7. The method of claim 1, further comprising:
    obtaining a plurality of data points along the wellbore, wherein each data point of the plurality of data points corresponds to a different measured depth along the wellbore;
    generating a plurality of rose diagrams for the plurality of data points;
    generating a three-dimensional resistivity model of the wellbore based on the plurality of rose diagrams by extrapolating the resistivity data between two consecutive data points of the plurality of data points based on one or more corresponding rose diagrams; and
    rendering the resistivity model for display on the display.

8. The method of claim 7, wherein the resistivity model includes an illustration of a cylinder along a length of the wellbore with a central axis of the cylinder representing the wellbore, and wherein a plurality of resistivity values associated with the resistivity data around the wellbore at the measured depth are visually represented by one or more of a distance of a corresponding portion of a surface of the cylinder from its central axis and at least one color of the corresponding portion of the surface of the cylinder.

9. The method of claim 8, wherein the cylinder has a variable radius and wherein a distance of a portion of a surface of the cylinder from a central axis of the cylinder at any point along a length of the cylinder is determined by a magnitude of the plurality of resistivity values from a rose diagram nearest to the portion of the surface of the cylinder along the central axis.

10. The method of claim 9, wherein the plurality of resistivity values at any point along the length of the wellbore are visually represented by the at least one color that corresponds to the portion of the surface of the cylinder, wherein assigning the at least one color to the portion of the surface of the cylinder comprises:
   comparing the plurality of resistivity values to a threshold resistivity value;
   assigning at least one first color to a first one or more resistivity values of the plurality of resistivity values in response to detecting that the first one or more resistivity values equal or exceed the threshold resistivity value; and
   assigning at least one second color to a second one or more resistivity values of the plurality of resistivity values in response to detecting that the second one or more resistivity values are below the threshold resistivity value.

11. The method of claim 1, further comprising receiving a user selection of the measured depth.

12. The method of claim 1, wherein the preconfigured plurality of bins comprises 8 bins, 16 bins, 32 bins or 128 bins.

13. The method of claim 1, wherein the resistivity data comprises azimuthal resistivity data.

14. An apparatus for processing resistivity data associated with a formation, comprising:
   a non-transitory storage medium;
   at least one processor coupled to the non-transitory storage medium, wherein the at least one processor executes one or more instructions stored on the non-transitory storage medium to:
      obtain the resistivity data including numerical resistivity values of formation resistivities of the formation proximate to a wellbore using electromagnetic signals;
      divide the resistivity data into a preconfigured plurality of bins, wherein each bin of the preconfigured plurality of bins corresponds to a direction or a range of directions from the wellbore into the formation, and wherein the resistivity data associated with each bin of the preconfigured plurality of bins comprises the numerical resistivity values measured in the direction or the range of directions;
      plotting on a rose diagram the numerical resistivity values collected at a measured depth of the wellbore, wherein the rose diagram comprises a circle having a preconfigured radius, wherein the rose diagram is divided into a preconfigured plurality of sectors, wherein each sector of the preconfigured plurality of sectors corresponds to a bin of the preconfigured plurality of bins, and wherein each sector of the preconfigured plurality of sectors visually illustrates the numerical resistivity values relating to the formation measured in a direction or range of directions from the wellbore corresponding to the bin; and
      render the generated rose diagram for display as an output on a display, wherein the rose diagram displays a distribution of the resistivity values in a cross-section perpendicular to the wellbore at the measured depth.

15. The apparatus of claim 14, wherein the at least one processor is configured to:
   plot the resistivity data for each bin of the preconfigured plurality of bins into a corresponding sector of the plurality of sectors of the rose diagram based on a logarithmic scale that extends radially outward from the center of the circle such that one or more resistivity values associated with the resistivity data increase from the center to the circumference of the circle; and
   plot the resistivity data for each bin of the preconfigured plurality of bins into the corresponding sector based on a color scale that extends radially outwards from the center of the circle such that each color visually represents a range of the one or more resistivity values, wherein a first color represents a lowest resistivity value at the center and a second color represents a highest resistivity value near the circumference of the circle.

16. The apparatus of claim 14, wherein the at least one processor is further configured to:
   obtain a plurality of data points along the wellbore, wherein each data point corresponds to a different measured depth along the wellbore;
   generate a plurality of rose diagrams for the plurality of data points;
   generate a three-dimensional resistivity model of the wellbore based on the plurality of rose diagrams by extrapolating the resistivity data between two consecutive data points of the plurality of data points based on corresponding rose diagrams; and
   render the resistivity model for display on the display.

17. The apparatus of claim 16, wherein the resistivity model includes an illustration of a cylinder along the length of the wellbore with a central axis of the cylinder representing the well bore, and wherein a plurality of resistivity values associated with the resistivity data around the wellbore at a measured depth are visually represented by at least one of a distance of a corresponding portion of a surface of the cylinder from its central axis or a color of the corresponding portion of the surface of the cylinder.

18. A non-transitory computer-readable medium storing one or more instructions that, when executed by at least one processor, cause the at least one processor to perform one or more operations comprising:
   obtaining resistivity data including numerical resistivity values of formation resistivities of a formation proximate to a wellbore using electromagnetic signals;
   dividing the resistivity data into a preconfigured plurality of bins, wherein each bin of the preconfigured plurality of bins corresponds to a direction or a range of directions from the wellbore into the formation, and wherein the resistivity data associated with each bin of the preconfigured plurality of bins comprises the numerical resistivity values measured in the direction or the range of directions;
   plotting on a rose diagram the numerical resistivity values collected at a measured depth of the wellbore, wherein the rose diagram comprises a circle having a preconfigured radius, wherein the rose diagram is divided into a preconfigured plurality of sectors, and wherein each sector of the plurality of sectors corresponds to a bin of the preconfigured plurality of bins and visually illustrates the numerical resistivity values relating to the formation measured in a direction or range of directions from the wellbore corresponding to the bin; and rendering the generated rose diagram for display as an output on a display, wherein the rose diagram displays a distribution of the resistivity values in a cross-section perpendicular to the wellbore at the measured depth.

19. The computer-readable medium of claim 18, wherein plotting on the rose diagram comprises:

plotting the resistivity data for each bin of the preconfigured plurality of bins into a corresponding sector of the plurality of sectors of the rose diagram based on a logarithmic scale that extends radially outward from the center of the circle such that one or more resistivity values associated with the resistivity data increase from the center to the circumference of the circle; and plotting the resistivity data for each bin of the preconfigured plurality of bins into the corresponding sector based on a color scale that extends radially outwards from the center of the circle such that each color visually represents a range of the one or more resistivity values, wherein a first color represents a lowest resistivity value at the center and a second color represents a highest resistivity value near the circumference of the circle.

20. The computer-readable medium of claim 18, further comprising instructions for:

obtaining a plurality of data points along the wellbore, wherein each data point corresponds to a different measured depth along the wellbore;

generating a plurality of rose diagrams for the plurality of data points;

generating a three-dimensional resistivity model of the wellbore based on the plurality of rose diagrams by extrapolating the resistivity data between two consecutive data points of the plurality of data points based on corresponding rose diagrams; and rendering the resistivity model for display on the display.

* * * * *